United States Patent
Ho et al.

(10) Patent No.: US 8,207,469 B2
(45) Date of Patent: Jun. 26, 2012

(54) METHOD FOR INHIBITING ELECTROMIGRATION-INDUCED PHASE SEGREGATION IN SOLDER JOINTS

(75) Inventors: Cheng-En Ho, Taipei County (TW); Wei-Hsiang Wu, Taipei (TW)

(73) Assignee: Yuan Ze University, Chung-Li (TW)

( * ) Notice: Subject to any disclaimer, the term of this patent is extended or adjusted under 35 U.S.C. 154(b) by 1038 days.

(21) Appl. No.: 12/156,560

(22) Filed: Jun. 2, 2008

(65) Prior Publication Data

US 2009/0294409 A1    Dec. 3, 2009

(51) Int. Cl.
*B23K 11/00*    (2006.01)

(52) U.S. Cl. .................................................. 219/85.15

(58) Field of Classification Search ............... 219/85.14, 219/85.15, 85.16, 85.22; 257/48, E23.002, 257/772, 773, 774, 775, 789
See application file for complete search history.

(56) References Cited

U.S. PATENT DOCUMENTS

| | | | | |
|---|---|---|---|---|
| 5,185,567 | A * | 2/1993 | Uchida | 323/267 |
| 6,767,411 | B2 * | 7/2004 | Yeh et al. | 148/24 |
| 2001/0002982 | A1 * | 6/2001 | Sarkhel et al. | 420/590 |
| 2005/0037601 | A1 * | 2/2005 | Hsu et al. | 438/612 |
| 2007/0103173 | A1 | 5/2007 | Cranford, Jr. et al. | |
| 2008/0217614 | A1 * | 9/2008 | Cranford et al. | 257/48 |

FOREIGN PATENT DOCUMENTS

CN    101567325    8/2010

OTHER PUBLICATIONS

Article titled "Polarity effect of electromigration on kinetics of intermetallic compound formation in Pb-free solder V-groove samples" authored by Gan et al., Journal of Appled Physics 97, pp. 063514-1-063514-10.
Article titled "Electromigration study in the eutectic SnBi solder joint on the Ni/Au metallization" authored by Chen et al., J. Mater. Res., vol. 21, No. 4, Apr. 2006, pp. 962-969.
Article titled "Recent advances on electromigration in very-large-scale-integration of interconnects" authored by K .N. Tu, Journal of Applied Physics, vol. 94, No. 9, pp. 5451-5473.
Article titled "Electromigration induced microstructure and morphological changes in eutectic SnPb solder joints" authored by Lee, et al., J. Mater. Res., vol. 22, No. 11, Nov. 2007, pp. 3265-3272.
"Office Action of Taiwan Counterpart Application" issued on Sep. 8, 2011, p. 1-p. 8.

* cited by examiner

*Primary Examiner* — Henry Yuen
*Assistant Examiner* — Thien S Tran
(74) *Attorney, Agent, or Firm* — J.C. Patents

(57) ABSTRACT

A method for inhibiting electromigration-induced phase segregation suitable for solder joint configurations used in a chip package is described as following. First, a chip package including a wiring board, a chip and numbers of solder joints is provided, wherein the chip is disposed on the wiring board, and the solder joints are disposed between the chip and the wiring board to electrically connect the chip to the wiring board. Next, a first current and a second current are alternately applied to a side of the solder joints, wherein flowing directions of the first current and the second current are opposite. The current density of the first current is $10^3 \sim 10^5$ A/cm$^2$, and the current density of the second current is $10^3 \sim 10^5$ A/cm$^2$.

18 Claims, 5 Drawing Sheets

METHOD FOR INHIBITING ELECTROMIGRATION-INDUCED PHASE SEGREGATION IN SOLDER JOINTS

BACKGROUND OF THE INVENTION

1. Field of the Invention

The present invention relates to a method for inhibiting electromigration-induced phase segregation. More particularly, the present invention relates to a method for inhibiting electromigration-induced phase segregation in solder joints.

2. Description of Related Art

Since the development of modern electronic devices advances lightness, slimness, shortness, smallness and multifunction, the demands of number of solder joints as well as the carried electric current in high performance devices are both increased to meet the above requirements. Moreover, the sizes of solder joints are also required to reduce, so as to improve the communication efficiency between devices, and to increase a plenty of input/output terminals in the same packing volume. Under such the scenario that reducing joints sizes accompanying with increasing the carried electric current, the current densities applied in solder joints hence are pushed to a level, in which electromigration are of concern. Electromigration refers to a mass transport phenomenon, which the thermally activated atoms/ions within a conductor would migrate in the direction as the electron flow due to momentum transfer between atoms/ions and electrons through the scattering. Such the mass flow would cause the mass depletion near the cathode and accumulation near the anode, leading to failures in conducting lines. In multi-phase alloys, electromigration becomes much more complicated, mainly responsible for the variation in the mobility of diffusion species. Such as in the eutectic PbSn (63 wt. % Sn-37 wt. % Pb) solder joints, the dominated diffusion species are known to be the Pb when the operation temperatures over 100° C., which would be driven toward anode more quickly. Since the solder is constrained by the solder/pad interfaces at the two ends, electromigration of Pb would be obstructed at the anode end of solder where the Pb accumulated as a layer. The occupancies of the Pb at the anode induces a back flow of Sn toward the cathode, resulting in the segregation of Pb-rich and Sn-rich phases as a two-layer structure. Such the electromigration-induced phase segregation seriously deteriorates the microstructure of eutectic solders, which has disturbed the electronic industry in recent years.

FIG. 1 is a schematic diagram illustrating solder joints electrically connected between a chip and a wiring board according to a conventional technique. Referring to FIG. 1, the solder joint 110 is electrically connected between a chip 120 and a wiring board 130. In the conventional technique, since the size of the solder joint 110 is decreased and the current flowing through the solder joint 110 is increased, the current density applied into the solder joint 110 is then increased significantly. Therefore, the electromigration behaviours trends to be obvious in the solder joint 110.

More particularly, when a flowing direction of a current I is from the wiring board 130 toward the chip 120 via the solder joint 110, it represents a flowing direction of an electron flow E is from the chip 120 toward the wiring board 130 via the solder joint 110. Now, thermally activated atoms (not shown) within the solder joint 110 are affected by the electron flow E, and thus the electromigration behaviours are likely to occur in the solder joint 110. A cross-sectional view of an as-reflow Cu/eutectic PbSn/Cu solder joint is shown in FIG. 2 (A). As can be clearly seen, the interwoven lamellar microstructure composed of a dark phase 140 and a white phase 150 reveals a typical eutectic structure of Pb—Sn alloys after a reflow. The dark phase 140 and white phase 150 are Pb-rich and Sn-rich respectively. At the interfaces of solder 160/Cu 170, the chemical reaction(s) between solder 160 and Cu 170 produced an equivalent reaction product(s) or intermetallic compound(s) (IMC) layer 180 at the both side. FIG. 2 (B) shows the same solder joint that had been imposed a current density of $10^4$ A/cm$^2$ for 7 days. The direction of the electron flow was from Cu 170 at the cathode side C to Cu 170 at the anode side A. Several changes in the microstructures compared to FIG. 2 (A) should be noted herein: (1) Pb had segregated from the interwoven lamellar structure of eutectic PbSn as a dense Pb-rich layer at the anode side A of solder 160. Next to the Pb-rich layer in solder 160, a layer of Sn-rich formed. (2) The morphologies of the IMC layers 180 were dissymmetry. The IMC layer 180 of the cathode C revealed irregularly in comparison with the one of the anode side A. (3) The depletion of Cu 170 metal of the cathode C is in a higher speed than that occurred in the anode A. The above three changes were known to be the electromigration behaviours in solder joints, which has disturbed the electronic industry in recent years.

SUMMARY OF THE INVENTION

The present invention is directed to a method for inhibiting electromigration-induced phase segregation in solder joints. These solder joints serve as electrically connections between a chip and a wiring board where a high electric current may be applied and the electromigration-induced phase segregation thereof occur during the operation of electronic devices.

The present invention is directed to a method for inhibiting electromigration-induced phase segregation in solder joints. These solder joints serve as electrically connections between a wiring board and a wiring board where a high electric current may be applied and the electromigration-induced phase segregation thereof occur during the operation of electronic devices.

To further describe the content of the present invention, a method for inhibiting electromigration-induced phase segregation, which is suitable for solder joint configurations used in a chip package is described as follows. First, a chip package including a wiring board, a chip and numbers of solder joints is provided, wherein the chip is disposed on the wiring board, and the solder joints are disposed between the chip and the wiring board to electrically connect the chip to the wiring board. Next, a first current and a second current are alternately applied to a side of the solder joints, wherein current directions of the first current and the second current are opposite. The current density of the first current is $10^3$~$10^5$ A/cm$^2$ and the current density of the second current is $10^3$~$10^5$ A/cm$^2$.

In an embodiment of the present invention, the side of the solder joint of the chip package is a side where the solder joint is connected to the chip.

In an embodiment of the present invention, the side of the solder joint of the chip package is a side where the solder joint is connected to the wiring board.

In an embodiment of the present invention, the solder joint includes a solder alloy.

In an embodiment of the present invention, the solder joint further includes a connection metal layer disposed between the solder and the chip.

In an embodiment of the present invention, the material of the connection metal layer includes copper-based alloy, nickel-based alloy, or combinations thereof.

In an embodiment of the present invention, the solder joint further includes a surface finish disposed between the solder and the wiring board.

In an embodiment of the present invention, the material of the surface finish includes copper-based alloy, nickel-based alloy or combinations thereof.

To further describe the content of the present invention, a method for inhibiting electromigration-induced phase segregation, which is suitable for solder joint configurations electrically connected between two wiring boards is described as follows. First, a first wiring board, a second wiring board and numbers of solder joints are provided, wherein the solder joints are disposed between the first wiring board and the second wiring board to electrically connect the first wiring board to the second wiring board. Next, a first current and a second current are alternately applied to a side of the solder joints, wherein current directions of the first current and the second current are opposite. The current density of the first current is $10^3 \sim 10^5$ A/cm$^2$ and the current density of the second current is $10^3 \sim 10^5$ A/cm$^2$.

In an embodiment of the present invention, the side of the solder joint is a side where the solder joint is connected to the first wiring board.

In an embodiment of the present invention, the side of the solder joints is a side where the solder joint is connected to the second wiring board.

In an embodiment of the present invention, the solder joint includes a solder alloy.

In an embodiment of the present invention, the solder joint further includes a first surface finish disposed between the solder and the first wiring board.

In an embodiment of the present invention, the material of the first surface finish includes copper-based alloy, nickel-based alloy or combinations thereof.

In an embodiment of the present invention, the solder joint further includes a second surface finish disposed between the solder and the second wiring board.

In an embodiment of the present invention, the material of the second surface finish includes copper-based alloy, nickel-based alloy or combinations thereof.

The following features are simultaneously suitable for embodiments applying the above two methods for inhibiting electromigration-induced phase segregation in solder joints.

In an embodiment of the present invention, frequency of the alternately applied first current and the second current is 1 (time/20 min).

In an embodiment of the present invention, the material of the solder is at least one of Pb—Sn alloy and Bi—Sn alloy.

In summary, in the present invention, the first current and the second current are alternately applied to a side of the solder joints. They are opposite in the flowing directions, so that the current stress acting on atoms could be counterbalanced. Therefore, the alternately generated first electron flow and the second electron flow may inhibit the electromigration-induced phase segregation to be present in the solder joints. Accordingly, transmission of electronic signals or energy via the method of the present invention for inhibiting electromigration-induced phase segregation, may effectively improve the microstructure of the solder joints.

In order to make the aforementioned and other objects, features and advantages of the present invention comprehensible, a preferred embodiment accompanied with figures is described in detail below.

BRIEF DESCRIPTION OF THE DRAWINGS

FIG. 2 (B) is an optical microscopy showing the same joint of FIG. 2 (A) but that had been imposed a current density of $10^4$ A/cm$^2$ for 7 days.

FIG. 7 (B) is an optical microscopy showing the same joint of FIG. 7 (A) but that had been imposed a current density of $10^4$ A/cm$^2$ for 7 days. During the period of the 7 days, the electric current was alternately applied to the solder joints in the opposite direction every 10 minutes, i.e. the frequency was 1 (time/20 minutes).

DESCRIPTION OF EMBODIMENTS

Figure 3:
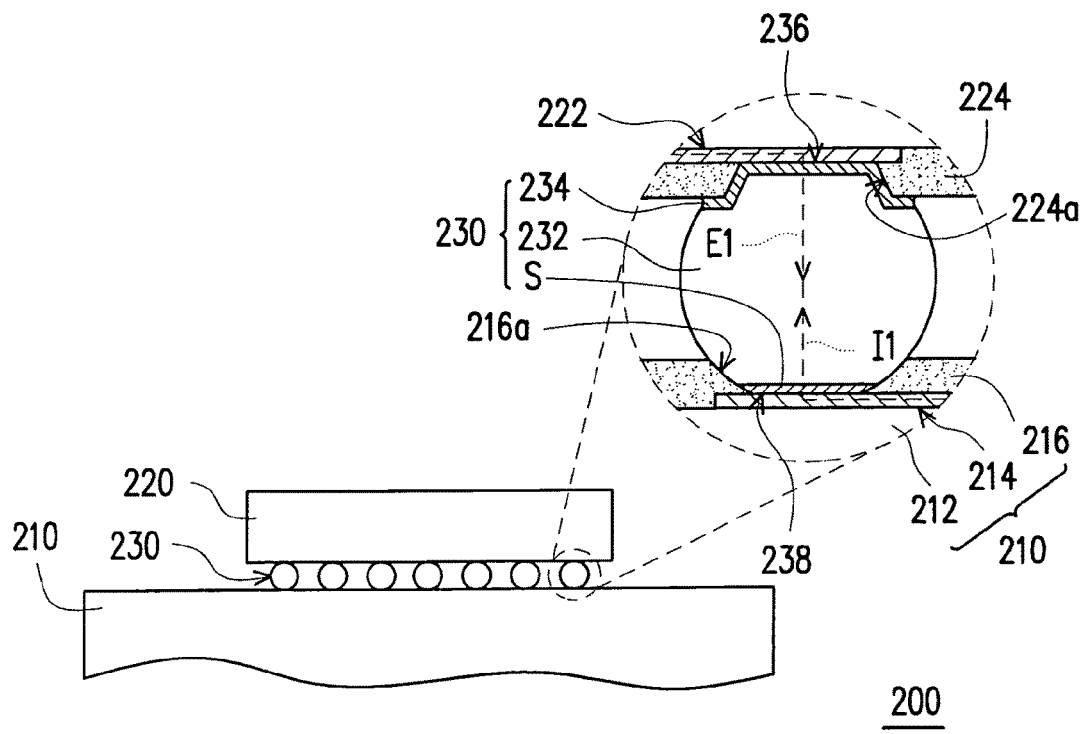
FIG. 3 and FIG. 4 are cross-sectional views of a chip package according to an embodiment of the present invention.
Figure 4:
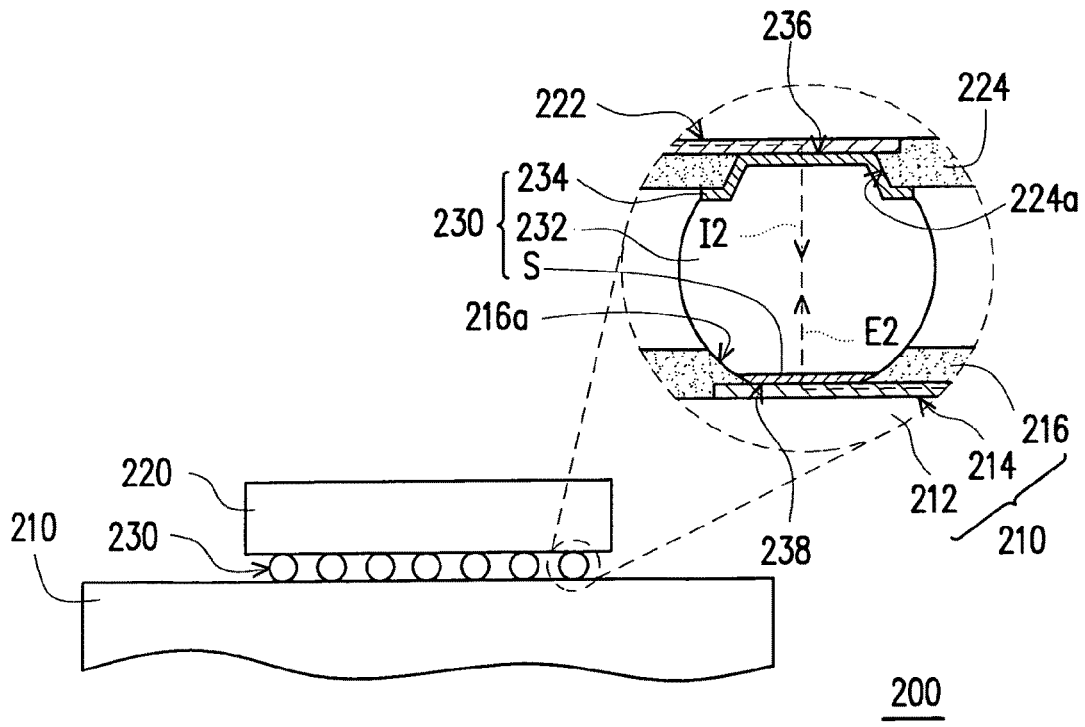

FIG. 3 and FIG. 4 are cross-sectional views of a chip package according to an embodiment of the present invention. A method for inhibiting electromigration-induced phase segregation of the present embodiment, which is suitable for solder joints used in a chip package is described as follows. Referring to FIG. 3 and FIG. 4, first, a chip package 200 including a wiring board 210, a chip 220 and numbers of solder joints 230 is provided, wherein the chip 220 is disposed on the wiring board 210, and the solder joints 230 are disposed between the chip 220 and the wiring board 210 to electrically connect the chip 220 to the wiring board 210.

In the present embodiment, the solder joint 230 includes a solder alloy 232. The material of the solder 232 may be at least one of Pb—Sn alloy, Bi—Sn alloy, or other alternate materials suitable for soldering and conducting.

Moreover, in the present embodiment, the solder joint 230 further includes a connection metal layer 234 disposed between the solder 232 and the chip 220. The material of the connection metal layer 234 may be copper-based alloy, nickel-based alloy or combinations thereof, or other alternate materials suitable for soldering and conducting.

In addition, in the present embodiment, the solder joint 230 further includes a surface finish S disposed between the solder 232 and the wiring board 210. In practical application, whether or not the solder joint 230 should have the surface finish S may be determined based on an actual requirement. The material of the surface finish S may be copper-based alloy, nickel-based alloy or combinations thereof, or other alternate materials suitable for soldering and conducting.

Moreover, in the present embodiment, the chip 220 further includes a first wiring layer 222 and a first solder mask 224, wherein the first wiring layer 222 and the solder joint 230 are electrically connected. The first solder mask 224 are coated on the first wiring layer 222 and has numbers of openings 224a, revealing a part of the first wiring layer 222. Moreover, the connection metal layer 234 may be disposed on the first wiring layer 222, where is exposed by the openings 224a.

In the present embodiment, the wiring board 210 includes a substrate 212, a second wiring layer 214 and a second solder mask 216, wherein the substrate 212 may be a dielectric substrate or a wiring substrate having multi wiring layers. The second wiring layer 214 is disposed on the substrate 212 and is electrically connected to the solder joint 230. The second solder mask 216 are coated on the second wiring layer 214 and has numbers of openings 216a, revealing a part of the second wiring layer 214. Moreover, the surface finish S may be disposed on the second wiring layer 214, where is exposed by the openings 216a.

Next, a first current I1 and a second current I2 are alternately applied to a side of the solder joint 230, wherein flowing directions of the first current I1 and the second current I2 are opposite. The above side of the solder joint 230 may be a side 236 where the solder joint 230 is connected to the chip 220. Certainly, the above side of the solder joint 230 may also be a side 238 where the solder joint 230 is connected to the circuit board 210.

Referring to FIG. 3, when the first current I1 is provided to the side 238 of the solder joint 230, a first electron flow E1 generated based on the first current I1 flows to the second wiring layer 214 of the wiring board 210 via the first wiring layer 222 of the chip 220 and the solder joint 230. Next, referring to FIG. 4, when the second current I2 is provided to the side 238 of the solder joint 230, a second electron flow E2 generated based on the second current I2 flows to the first wiring layer 222 of the chip 220 via the second wiring layer 214 of the wiring board 210 and the solder joint 230.

Figure 1:
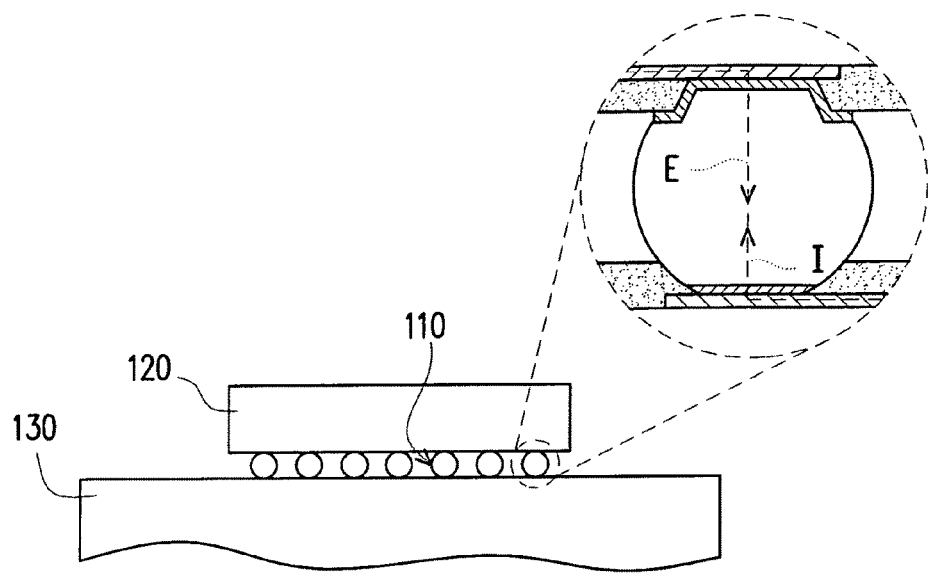
FIG. 1 is a schematic diagram illustrating a solder joint configuration electrically connected between a chip and a wiring board according to a conventional technique.
Figure 2A:
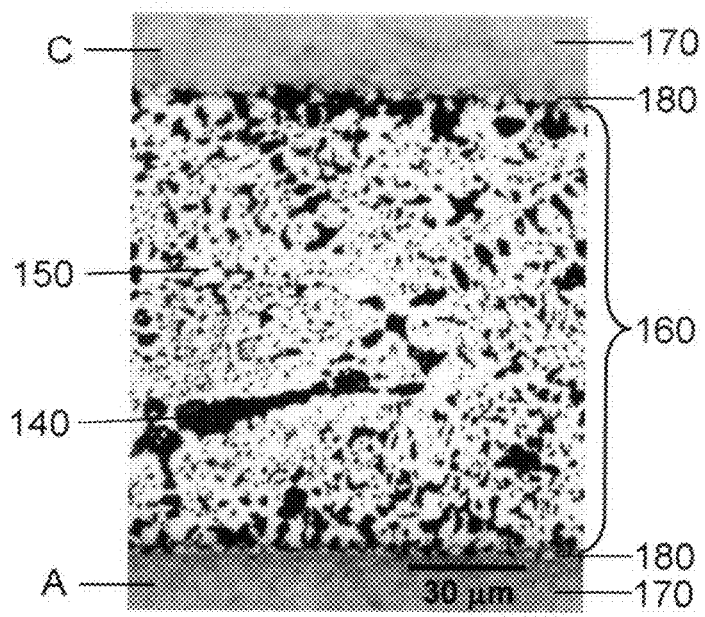
FIG. 2 (A) is an optical microscopy showing a cross-sectional view of the microstructure of a Cu/eutectic PbSn/Cu solder joint after reflow.
Figure 2B:
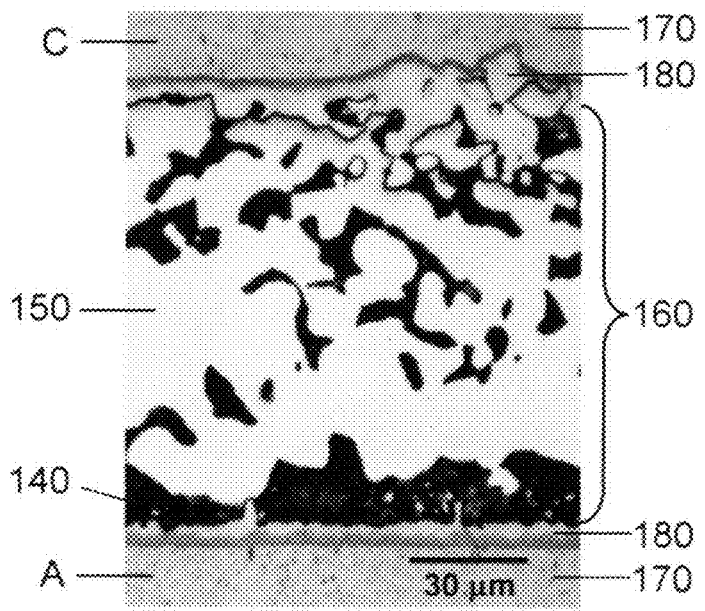

As described above, when the first current I1 and the second current I2 are alternately applied to a side of the solder joint 230, the first electron flow E1 and the second electron flow E2 are alternately generated in the opposite direction accordingly. Therefore, the alternately imposing first electron flow E1 and the second electron flow E2 may inhibit the electromigration-induced phase segregation (not shown) to appear in the solder joint 230. Accordingly, the problem of the conventional technique that non-uniform phase distribution (or phase segregation) in the solder joint 110 due to the electromigration of the atoms of the solder joint 110 (referring to FIG. 1) could be inhibited effectively. Similarly, the method for inhibiting the electromigration-induced phase segregation of the present embodiment may also be applied to the wiring board or the wirings of the chip, namely, a first current and a second current may be alternately applied to a side of the wiring, wherein flowing directions of the first current and the second current are opposite.

In the present embodiment, frequency of the alternately applied first current and the second current is 1 (time/20 min). Moreover, in the present embodiment, the first current I1 may also be continuously provided in a first time interval, and the second current I2 is continuously provided in a second time interval, and then the above steps are sequentially repeated. Moreover, the first time interval and the second time interval may be equal or unequal. A current density of the first current I1 may be $10^3 \sim 10^5$ A/cm$^2$, and a current density of the second current I2 may be $10^3 \sim 10^5$ A/cm$^2$.

Figure 5:
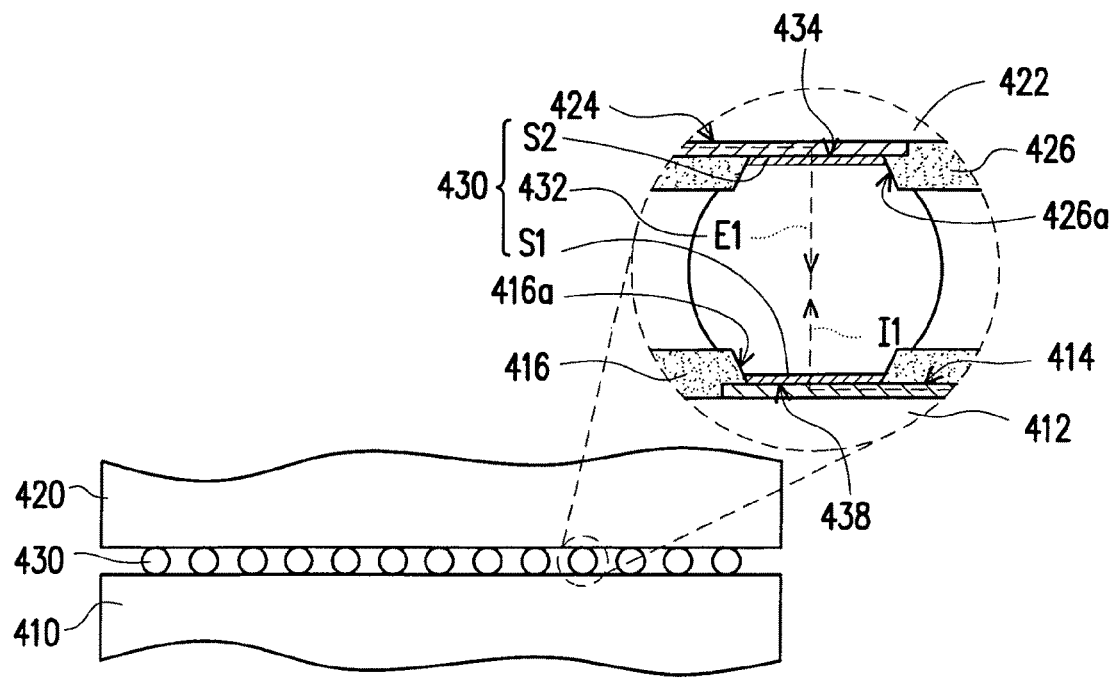
FIG. 5 and FIG. 6 are cross-sectional views of solder joints electrically connected between two wiring boards according to an embodiment of the present invention.
Figure 6:
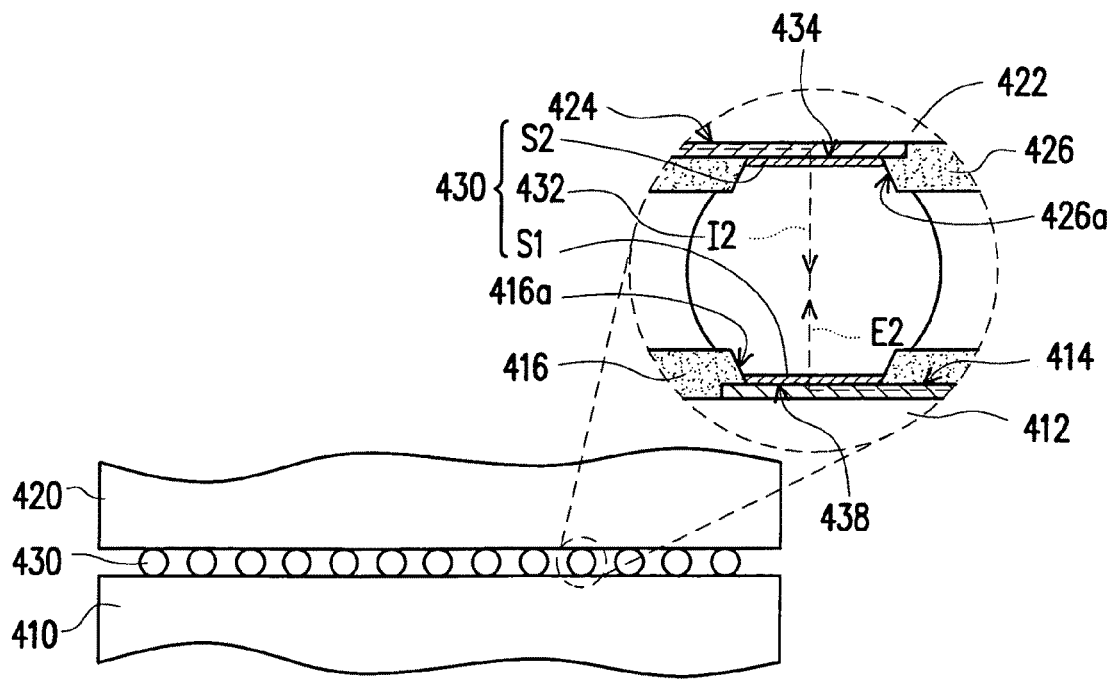

FIG. 5 and FIG. 6 are cross-sectional views of solder joints electrically connected between two wiring boards according to an embodiment of the present invention. Referring to FIG. 5 and FIG. 6, first, a first wiring board 410, a second wiring board 420 and numbers of solder joints 430 are provided. Wherein, the second wiring board 420 is disposed on the first wiring board 410. The solder joints 430 are disposed between the first wiring board 410 and the second wiring board 420 to electrically connect the first wiring board 410 to the second wiring board 420. Next, a first current I1 and a second current I2 are alternately applied to a side of the solder joints 430, wherein current directions of the first current I1 and the second current I2 are opposite.

In the present embodiment, the solder joint 430 includes a solder alloy 432, and the material of the solder 432 may be at least one of Pb—Sn alloy, Bi—Sn alloy, or other alternate materials suitable for soldering and conducting.

In addition, in the present embodiment, the solder joint 430 further includes a first surface finish S1 and a second surface finish S2, wherein the first surface finish S1 is disposed between the solder 432 and the first wiring board 410, and the second surface finish S2 is disposed between the solder 432 and the second wiring board 420.

Moreover, in an actual application, whether or not the solder joint 430 should have the first and the second surface finishes S1 and S2 may be determined based on an actual requirement. The materials of the first and the second surface finishes S1 and S2 may be copper-based alloy, nickel-based alloy or combinations thereof, or other alternate materials suitable for soldering and conducting.

Moreover, in the present embodiment, the first wiring board 410 includes a first substrate 412, a first wiring layer 414 and a first solder mask 416, wherein the first substrate 412 may be a dielectric substrate or a wiring substrate having multi wiring layers. The first wiring layer 414 is disposed on the first substrate 412 and is electrically connected to the solder joint 430. The first solder mask 416 is disposed on the first substrate 412 and covers a part of the first wiring layer 414, and the first solder mask 416 has numbers of first openings 416a for exposing a part of the first wiring layer 414. Moreover, the first surface finish S1 may be disposed on the first wiring layer 414 exposed by the first openings 416a.

In the present embodiment, the second wiring board 420 includes a second substrate 422, a second wiring layer 424 and a second solder mask 426, wherein the second substrate 422 may be the dielectric substrate or the wiring substrate having multi wiring layers. The second wiring layer 424 is disposed on the second substrate 422 and is electrically connected to the solder joint 430. The second solder mask 426 is disposed on the second substrate 422 and coated on the second wiring layer 424, and the second solder mask 426 has numbers of second openings 426a, revealing a part of the second wiring layer 424. Moreover, the second surface finish S2 may be disposed on the second wiring layer 424, where is exposed by the second openings 426a.

Next, the first current I1 and the second current I2 are alternately applied to a side of the solder joint 430, wherein flowing directions of the first current I1 and the second current I2 are opposite. The above side of the solder joint 430 may be a side 438 where the solder joint 430 is connected to the first wiring board 410. Certainly, the above side of the solder joint 430 may also be a side 434 where the solder joint 430 is connected to the second circuit board 420.

Referring to FIG. 5, when the first current I1 is provided to the side 438 of the solder joint 430, a first electron flow E1 generated based on the first current I1 flows to the first wiring layer 414 of the first wiring board 410 via the second wiring layer 424 of the second wiring board 420 and the solder joint 430.

Next, referring to FIG. 6, when the second current I2 is provided to the side 438 of the solder joint 430, a second electron flow E2 generated based on the second current I2 flows to the second wiring layer 424 of the second wiring board 420 via the first wiring layer 414 of the first wiring board 410 and the solder joint 430.

As described above, when the first current I1 and the second current I2 are alternately applied to a side of the solder joint 430, the first electron flow E1 and the second electron flow E2 are alternately generated in the opposite direction accordingly. Therefore, the alternately generated first electron flow E1 and the second electron flow E2 may inhibit the electromigration of the atoms (not shown) in the solder joint 430.

In the present embodiment, frequency of the alternately applied first current and the second current is 1 (time/20 min). Moreover, in the present embodiment, the first current I1 may also be continuously provided in the first time interval, and the second current I2 is continuously provided in the second time interval, and then the above steps are sequentially repeated. Moreover, the first time interval and the second time interval may be equal or unequal. A current density of the first current I1 may be $10^3$~$10^5$ A/cm$^2$, and a current density of the second current I2 may be $10^3$~$10^5$ A/cm$^2$.

Figure 7A:
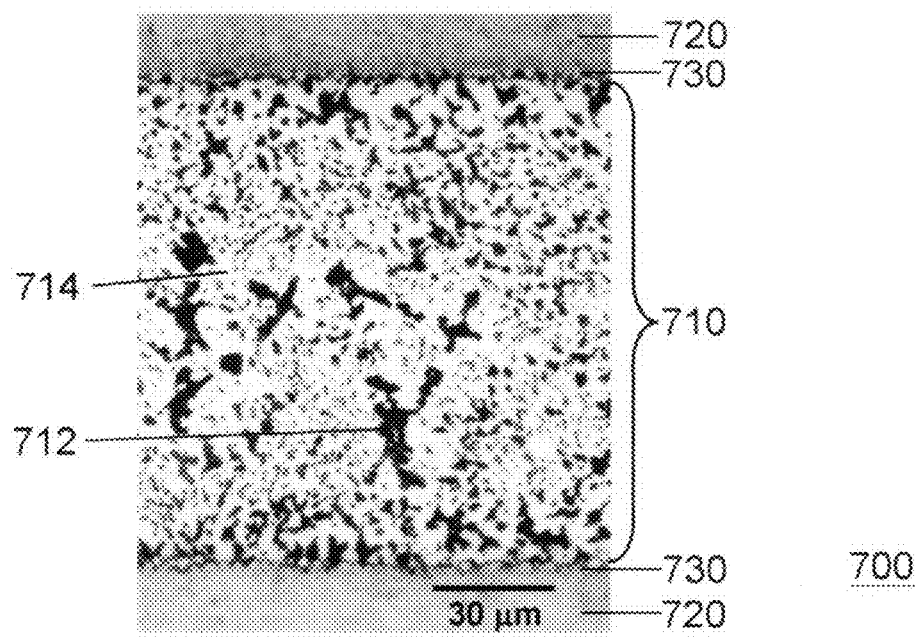
FIG. 7 (A) is an optical microscopy showing a cross-sectional view of the microstructure of a Cu/eutectic PbSn/Cu solder joint after reflow.
Figure 7B:
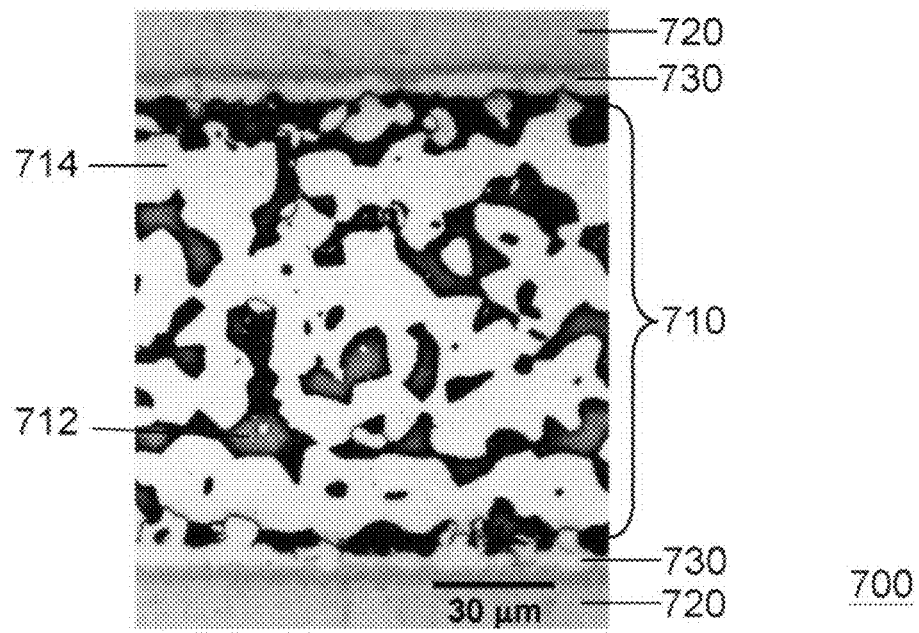

Referring to FIG. 7 (A), a cross-sectional view of an as-reflow Cu/eutectic PbSn/Cu solder joint is shown. As can be clearly seen, a typical eutectic structure of Pb—Sn alloys after a reflow is in the solder 710. The dark phase 712 and white phase 714 are Pb-rich and Sn-rich respectively. At the interfaces of solder 710/Cu 720, the chemical reaction between solder 710 and Cu 720 produced an equivalent reaction product(s) or an intermetallic compound(s) layer 730 at the both side.

Referring to FIG. 7 (B), the same joint shown in FIG. 7 (A) but that had been imposed a current density of $10^4$ A/cm$^2$ for 7 days. During imposing the electric current, the direction of the electric current was reversed every 10 minutes. The Pb-rich 712 and the Sn-rich 714 phases still distributed randomly in the solder 710 even the solder joint 700 had been imposed the electric current for 7 days. In addition, the morphologies of the intermetallic compound (s) layer 730 formed at the both solder 710/Cu 720 interfaces were similar by alternately applying a first current and a second current into the solder joint 700. Compare to the Cu 170 at the cathode side C, there was no excessive depletion of Cu 720 appeared in the solder joint.

In summary, in the present invention, the first current and the second current are alternately applied to a side of the solder joints. Now, the first electron flow and the second electron flow are alternately generated in the opposite direction. Therefore, the alternately generated the first electron flow and the second electron flow may inhibit the electromigration of the atoms in the solder joints. Accordingly, adverse circumstances in the conventional technique, electromigration behaviours such as the Pb—Sn phase segregation, dissymmetry IMC morphology at the both side of solder/pad interfaces, fast depletion of the pad of the cathode side may be avoided, and therefore the microstructure of the solder joints may be significantly improved. Similarly, the method for inhibiting the electromigration-induced phase segregation of the present embodiment may also be applied to the wiring board or the wirings of the chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for inhibiting electromigration-induced phase segregation, suitable for solder joints used in a chip package, the method comprising: providing a chip package including a wiring board, a chip and a number of solder joints, wherein the chip is disposed on the wiring board, and the solder joints are disposed between the chip and the wiring board to electrically connect the chip to the wiring board; and alternately applying a first current and a second current to a side of the solder joints, wherein the first current is continuously applied for a first period and then the second current is continuously applied for a second period that is equal to the first period, current directions of the first current and the second current are opposite, and the current density of the first current is $10^3$-$10^5$ A/cm$^2$, and the current density of the second current is $10^3$-$10^5$ A/cm$^2$, wherein an alternate frequency of the first current and the second current is 0.05 min$^{-1}$ (1 cycle per 20 minutes).

2. The method for inhibiting electromigration-induced phase segregation as claimed in claim 1, wherein the side of the solder joint of the chip package is a side where the solder joint is connected to the chip.

3. The method for inhibiting electromigration-induced phase segregation as claimed in claim 1, wherein the side of the solder joint of the chip package is a side where the solder joint is connected to the wiring board.

4. The method for inhibiting electromigration-induced phase segregation as claimed in claim 1, wherein the solder joint comprises a solder.

5. The method for inhibiting electromigration-induced phase segregation as claimed in claim 4, wherein the material of the solder is at least one of Pb—Sn alloy and Bi—Sn alloy.

6. The method for inhibiting electromigration-induced phase segregation as claimed in claim 4, wherein the solder joint further comprises a connection metal layer disposed between the solder and the chip.

7. The method for inhibiting electromigration-induced phase segregation as claimed in claim 6, wherein the material of the connection metal layer comprises copper-based alloy, nickel-based alloy or combinations thereof.

8. The method for inhibiting electromigration-induced phase segregation as claimed in claim 4, wherein the solder joint further comprises a surface finish disposed between the solder and the wiring board.

9. The method for inhibiting electromigration-induced phase segregation as claimed in claim 8, wherein the material of the surface finish comprises copper-based alloy, nickel-based alloy or combinations thereof.

10. A method for inhibiting electromigration-induced phase segregation, suitable for solder joints electrically connected between two wiring boards, the method comprising: providing a first wiring board, a second wiring board and numbers of solder joints, wherein the second wiring board is disposed on the first wiring board, and the solder joints are disposed between the first wiring board and the second wiring board to electrically connect the first wiring board to the second wiring board; and alternately providing a first current and a second current to a side of the solder joints, wherein the first current is continuously provided for a first period and then the second current is continuously provided for a second period that is equal to the first period, current directions of the first current and the second current are opposite, and the current density of the first current is $10^3$-$10^5$ A/cm$^2$, and the current density of the second current is $10^3$-$10^5$ A/cm$^2$, wherein an alternate frequency of the first current and the second current is 0.05 min$^{-1}$ (1 cycle per 20 minutes).

11. The method for inhibiting electromigration-induced phase segregation as claimed in claim 10, wherein the side of the solder joint is a side where the solder joint is connected to the first wiring board.

12. The method for inhibiting electromigration-induced phase segregation as claimed in claim 10, wherein the side of the solder joint is a side where the solder joint is connected to the second wiring board.

13. The method for inhibiting electromigration-induced phase segregation as claimed in claim 10, wherein the solder joint comprises a solder.

14. The method for inhibiting electromigration-induced phase segregation as claimed in claim 13, wherein the material of the solder is at least one of Pb—Sn alloy and Bi—Sn alloy.

15. The method for inhibiting electromigration-induced phase segregation as claimed in claim 13, wherein the solder joint further comprises a first surface finish disposed between the solder and the first wiring board.

16. The method for inhibiting electromigration-induced phase segregation as claimed in claim 15, wherein the material of the first surface finish comprises copper-based alloy, nickel-based alloy or combinations thereof.

17. The method for inhibiting electromigration-induced phase segregation as claimed in claim 13, wherein the solder joint further comprises a second surface finish disposed between the solder and the second wiring board.

18. The method for inhibiting electromigration-induced phase segregation as claimed in claim 17, wherein the material of the second surface finish comprises copper-based alloy, nickel-based alloy or combinations thereof.

* * * * *